(12) United States Patent
Kim et al.

(10) Patent No.: US 11,276,715 B2
(45) Date of Patent: Mar. 15, 2022

(54) DISPLAY PANEL

(71) Applicant: SAMSUNG DISPLAY CO., LTD., Yongin-si (KR)

(72) Inventors: Dongwoo Kim, Yongin-si (KR); Junhyun Park, Suwon-si (KR); Sungjae Moon, Seongnam-si (KR); Ansu Lee, Seoul (KR); Kangmoon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 91 days.

(21) Appl. No.: 16/784,743

(22) Filed: Feb. 7, 2020

(65) Prior Publication Data
US 2020/0258920 A1    Aug. 13, 2020

(30) Foreign Application Priority Data
Feb. 12, 2019    (KR) .................. 10-2019-0016279

(51) Int. Cl.
*H01L 27/14*    (2006.01)
*H01L 27/12*    (2006.01)
*H01L 27/32*    (2006.01)

(52) U.S. Cl.
CPC ........ *H01L 27/1251* (2013.01); *H01L 27/124* (2013.01); *H01L 27/1225* (2013.01); *H01L 27/3262* (2013.01); *H01L 27/3265* (2013.01)

(58) Field of Classification Search
CPC .............. H01L 27/1251; H01L 27/1225; H01L 27/124

USPC ........................................ 257/43, 59, 71, 72
See application file for complete search history.

(56) References Cited

U.S. PATENT DOCUMENTS

| | | | |
|---|---|---|---|
| 9,911,762 B2 | 3/2018 | Yan et al. | |
| 9,911,763 B2* | 3/2018 | Seo ..................... | H01L 27/1214 |
| 9,972,668 B2 | 5/2018 | Shi et al. | |
| 9,978,826 B2* | 5/2018 | Park ..................... | H01L 27/3248 |
| 10,083,990 B2* | 9/2018 | Oh ..................... | H01L 27/1255 |
| 2018/0097047 A1 | 4/2018 | Jung et al. | |
| 2018/0102095 A1 | 4/2018 | Han | |
| 2018/0108720 A1 | 4/2018 | Kim et al. | |

FOREIGN PATENT DOCUMENTS

| | | |
|---|---|---|
| KR | 20150075512 | 7/2015 |
| KR | 20170027349 | 3/2017 |

* cited by examiner

*Primary Examiner* — Tan N Tran
(74) *Attorney, Agent, or Firm* — F. Chau & Associates, LLC

(57) ABSTRACT

A display panel includes a first transistor that contains oxide, a capacitor that includes a first electrode and a second electrode, a light emitting element connected to the capacitor and the first transistor, and an additional control electrode connected to the second electrode. The first and second electrodes are disposed on different layers from each other and are coupled to a first control electrode and a first output electrode, respectively, of the first transistor, and the light emitting element includes a light emitting layer. The additional control electrode overlap the first control electrode and the first semiconductor pattern, when viewed in a plan view. The additional control electrode and the second electrode are disposed on the same layer and form a single body.

22 Claims, 15 Drawing Sheets

DISPLAY PANEL

CROSS-REFERENCE TO RELATED APPLICATIONS

This U.S. non-provisional patent application claims priority under 35 U.S.C. § 119 from, and the benefit of, Korean Patent Application No. 10-2019-0016279, filed on Feb. 12, 2019 in the Korean Intellectual Property Office, the contents of which are herein incorporated by reference in their entirety.

BACKGROUND

Embodiments of the present disclosure are directed to a display panel, and in particular, to a display panel with improved electric characteristics.

A display panel includes a plurality of pixels that display an image. Each of the pixels includes a pixel driving circuit and a display element connected to the pixel driving circuit. The pixel driving circuit includes at least one thin film transistor and a capacitor. The thin film transistor and the capacitor that constitute the pixel driving circuit control the display element, in response to electrical signals received from the pixel driving circuit.

SUMMARY

An embodiment of the inventive concept provides a display panel with improved electrical and display characteristics.

An embodiment of the inventive concept provides a display panel fabricated by a simplified process.

According to an embodiment of the inventive concept, a display panel includes a first transistor that includes a first semiconductor pattern that contains oxide, a first control electrode that overlaps the first semiconductor pattern, and a first input electrode and a first output electrode, where the first input electrode and the first output electrode are disposed on a different layer from the first control electrode and are respectively coupled to two different portions of the first semiconductor pattern, a capacitor that includes a first electrode coupled to the first control electrode and a second electrode disposed on a different layer from the first electrode and coupled to the first output electrode, a light emitting element connected to the capacitor and the first transistor and that includes a light emitting layer, and an additional control electrode connected to the second electrode and that overlaps the first control electrode and the first semiconductor pattern in a plan view. The additional control electrode and the second electrode are disposed on a same layer to form a single body.

In an embodiment, the first semiconductor pattern is disposed between the additional control electrode and the first control electrode, and the additional control electrode is disposed below the first semiconductor pattern, when viewed in a sectional view.

In an embodiment, the additional control electrode overlaps a channel region of the first semiconductor pattern, when viewed in a plan view.

In an embodiment, the display panel further includes a first metal pattern spaced apart from the first semiconductor pattern and that forms a first capacitor along with the first input electrode. The first metal pattern and the second electrode are disposed on a same layer.

In an embodiment, the first metal pattern and the second electrode are connected to each other and form a single body.

In an embodiment, the first metal pattern and the additional control electrode are connected to each other and form a single body.

In an embodiment, the first input electrode receives a power voltage higher than a cathode voltage of the light emitting element.

In an embodiment, the first capacitor has capacitance determined by a potential difference between an anode voltage of the light emitting element and the power voltage.

In an embodiment, the display panel further includes a second metal pattern spaced apart from the first semiconductor pattern and that forms a second capacitor along with the first control electrode. The second metal pattern and the second electrode are disposed on a same layer.

In an embodiment, the second metal pattern and the second electrode are connected to each other and form a single body.

In an embodiment, the display panel further includes a second transistor that includes a second semiconductor pattern that contains silicon, a second control electrode that overlaps the second semiconductor pattern, and a second input electrode and a second output electrode, where the second input electrode and the second output electrode are respectively coupled to two different portions of the second semiconductor pattern, and a third transistor that includes a third semiconductor pattern that contains silicon and is spaced apart from the second semiconductor pattern, a third control electrode that overlaps the third semiconductor pattern, and a third input electrode and a third output electrode, where the third input electrode and the third output electrode are respectively coupled to two different portions of the third semiconductor pattern. The second output electrode is coupled to the first electrode, and the third output electrode is coupled to the second electrode.

In an embodiment, the display panel further includes an upper electrode disposed on the second control electrode and that overlaps the second control electrode in a plan view. The second control electrode and the first electrode are disposed on a same layer, and the upper electrode and the second electrode are disposed on a same layer.

According to an embodiment of the inventive concept, a display panel includes a first transistor that includes a first semiconductor pattern that contains oxide, a first control electrode that overlaps a channel region of the first semiconductor pattern, a first input electrode coupled to an input region of the first semiconductor pattern, and a first output electrode coupled to an output region of the first semiconductor pattern, a first capacitor connected to the first transistor, where the first capacitor includes a first electrode and a second electrode that face each other, and a light emitting element connected to the second electrode, where the light emitting element includes a light emitting layer. The second electrode includes a first portion that overlaps the first electrode and a second portion that overlaps the channel region of the first semiconductor pattern, when viewed in a plan view.

In an embodiment, the first output electrode is connected to the second electrode.

In an embodiment, the second electrode further includes a third portion connected to the second portion, where the third portion is spaced apart from the first semiconductor pattern and overlaps the first input electrode, when viewed in a plan view.

In an embodiment, the second electrode further includes a fourth portion connected to the second portion, where the fourth portion is spaced apart from the first semiconductor pattern and overlaps the first control electrode, when viewed in a plan view.

In an embodiment, the display panel further includes a second transistor that includes a second semiconductor pattern that contains silicon, a second control electrode that overlaps the second semiconductor pattern, and a second input electrode and a second output electrode, where the second input electrode and the second output electrode are respectively coupled to two different portions of the second semiconductor pattern. The second output electrode is coupled to the first electrode.

In an embodiment, the second control electrode and the first electrode are disposed on a same layer.

In an embodiment, the display panel further includes a third transistor that includes a third semiconductor pattern that contains silicon and is spaced apart from the second semiconductor pattern, a third control electrode that overlaps the third semiconductor pattern, and a third input electrode and a third output electrode, where the third input electrode and the third output electrode are respectively coupled to two different portions of the third semiconductor pattern. The third output electrode is coupled to the second electrode.

According to an embodiment of the inventive concept, a display panel includes a first transistor that includes a first semiconductor pattern that contains an oxide, a first control electrode that overlaps the first semiconductor pattern, and a first input electrode and a first output electrode, wherein the first input electrode and the first output electrode are disposed on a different layer from the first control electrode and are respectively coupled to two different portions of the first semiconductor pattern, a capacitor that includes a first electrode coupled to the first control electrode, and a second electrode disposed on a different layer from the first electrode and coupled to the first output electrode, and an additional control electrode connected to the second electrode and that overlaps the first control electrode and the first semiconductor pattern in a plan view. The additional control electrode and the second electrode are disposed on a same layer and form a single body. The first semiconductor pattern is disposed between the additional control electrode and the first control electrode, and the additional control electrode is disposed below the first semiconductor pattern, when viewed in a sectional view.

Figure 1:
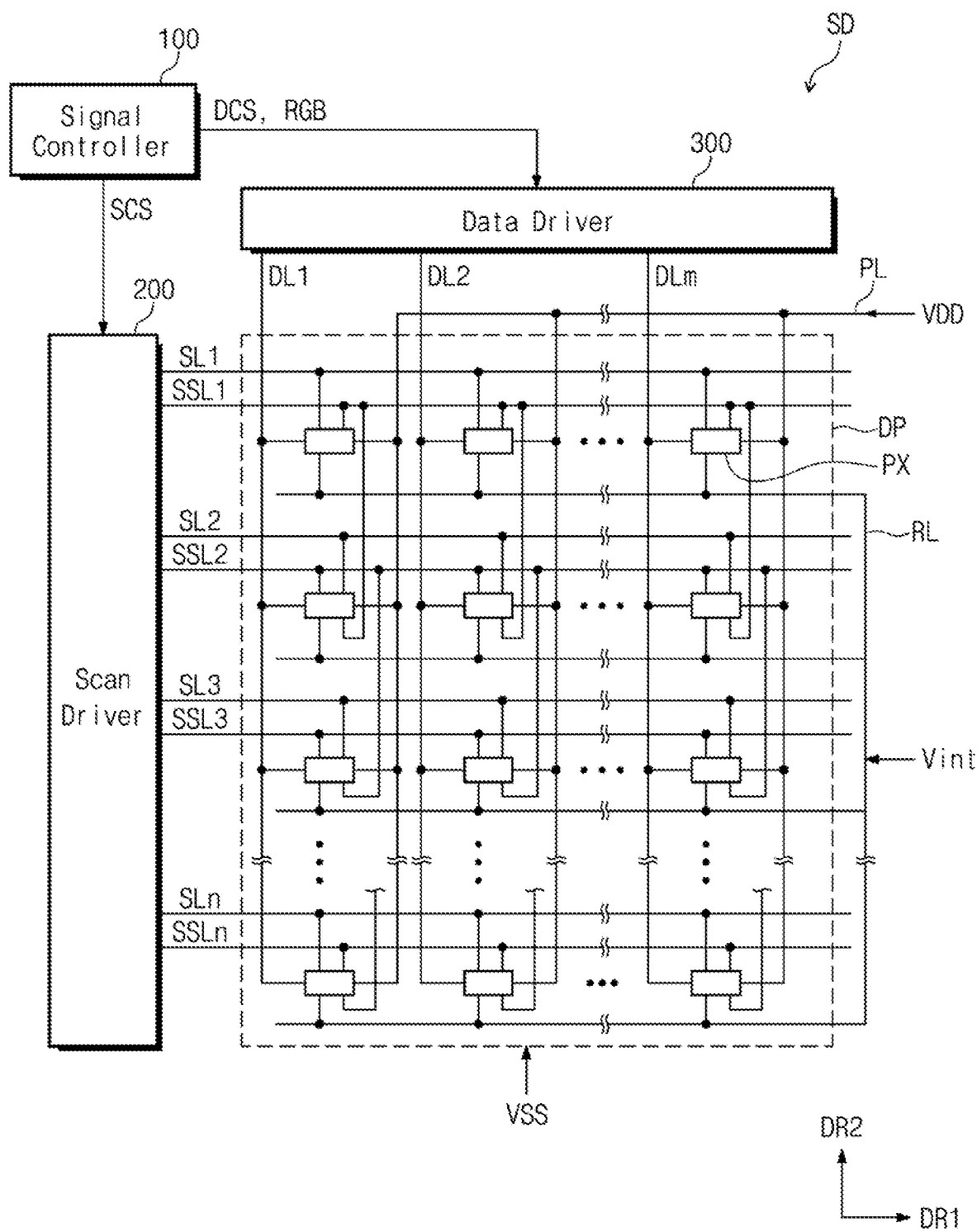
FIG. 1 is a block diagram of a display device according to an embodiment of the inventive concept.

It should be noted that these drawings are not, however, to scale and may not precisely reflect the precise structural or performance characteristics of any given embodiment, and should not be interpreted as defining or limiting the range of values or properties encompassed by exemplary embodiments. The use of similar or identical reference numbers in the various drawings may indicate the presence of a similar or identical element or feature.

DETAILED DESCRIPTION

Exemplary embodiments of the inventive concepts will now be described more fully with reference to the accompanying drawings, in which exemplary embodiments are shown. Exemplary embodiments of the inventive concepts may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present. Like numbers may indicate like elements throughout.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments of the inventive concepts are described herein with reference to cross-sectional illustrations that are schematic illustrations of idealized embodiments and intermediate structures of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing.

FIG. 1 is a block diagram of a display device SD according to an embodiment of the inventive concept.

As shown in FIG. 1, according to an embodiment, the display device SD includes a signal controller 100, a scan driver 200, a data driver 300, and a display panel DP. The display panel DP displays an image based on electrical signals provided thereto.

According to an embodiment, the signal controller 100 receives input image signals and converts the input image signals to image data D-RGB, which have a data format suitable for the scan driver 200. The signal controller 100 outputs the image data D-RGB and various control signals DCS and SCS.

According to an embodiment, the scan driver 200 receives the scan control signal SCS from the signal controller 100. The scan control signal SCS includes a vertical start signal used to initiate operation of the scan driver 200, a clock signal used to determine when signals are output, and so forth.

According to an embodiment, the scan driver 200 generates a plurality of scan signals and sequentially outputs the scan signals to a plurality of scan lines SL1-SLn. In addition, the scan driver 200 generates a plurality of emission control signals and outputs the emission control signals to a plurality of emission lines SSL1-SSLn, in response to the scan control signal SCS.

FIG. 1 illustrates an embodiment in which the scan signals and the emission control signals are output from one scan driver 200, but embodiments of the inventive concept are not limited thereto. In an embodiment, a plurality of scan driving circuits are provided to output separate scan signals and separate emission control signals. Furthermore, in an embodiment, the driving circuit that generates and outputs the scan signals is independent of the driving circuit that generates and outputs the emission control signals.

According to an embodiment, the data driver 300 receives the data control signal DCS and the image data D-RGB from the signal controller 100. The data driver 300 converts the image data D-RGB into data signals and outputs the data signals to data lines DL1-DLm. The data signals are analog voltages whose levels correspond to gradation levels of the image data D-RGB.

According to an embodiment, the display panel DP includes the scan lines SL1-SLn, the emission lines SSL1-SSLn, the data lines DL1-DLm, and a plurality of pixels PX. The scan lines SL1-SLn extend in a first direction DR1 and are spaced apart in a second direction DR2 perpendicular to the first direction DR1.

According to an embodiment, each of the emission lines SSL1-SSLn is parallel to a corresponding one of the scan lines SL1-SLn. The data lines DL1-DLm cross the scan lines SL1-SLn and are electrically separated from the scan lines SL1-SLn.

According to an embodiment, each of the pixels PX is coupled to a corresponding one of the scan lines SL1-SLn, a corresponding one of the emission lines SSL1-SSLn, and a corresponding one of the data lines DL1-DLm.

According to an embodiment, each of the pixels PX receives a first power voltage VDD and a second power voltage VSS lower than the first power voltage VDD. Each of the pixels PX is coupled to a power line PL, over which the first power voltage VDD is transmitted. Each of the pixels PX is coupled to an initialization line RL that transmits an initialization voltage Vint.

According to an embodiment, each of the pixels PX is electrically connected to one scan line and two emission lines. For example, as shown in FIG. 1, each of the pixels of the second pixel row is connected to the second scan line SL2 and the first and the second emission lines SSL1 and SSL2.

According to an embodiment, the display panel DP further includes a plurality of dummy scan lines. The display panel DP further includes a dummy scan line connected to the pixels PX of the first pixel row and a dummy scan line connected to the pixels PX of the n-th pixel row. In addition, some pixels of a pixel column connected to one of the data lines DL1-DLm are connected to each other through the power line PL. Two adjacent pixels in the pixel column are electrically connected to each other through one emission line.

According to an embodiment, each of the pixels PX includes an organic light emitting element and a pixel driving circuit that controls a light emission operation of the organic light emitting element. The pixel driving circuit includes a plurality of thin film transistors and at least one capacitor. At least one of a driving circuit SDC and the data driver 300 includes thin film transistors, which are formed using the same process as that for the pixel driving circuit.

In a present embodiment, the scan lines SL1-SLn, the emission lines SSL1-SSLn, the data lines DL1-DLm, the power line PL, the initialization line RL, the pixels PX, the scan driver 200, and the data driver 300 are formed on a single base substrate through a plurality of photolithography processes. However, embodiments of the inventive concept are not limited to this example, and in an embodiment, the scan driver 200 or the data driver 300 may be mounted on an additional circuit substrate, etc., and then be electrically connected to the display panel DP through an adhesion process.

Figure 2:
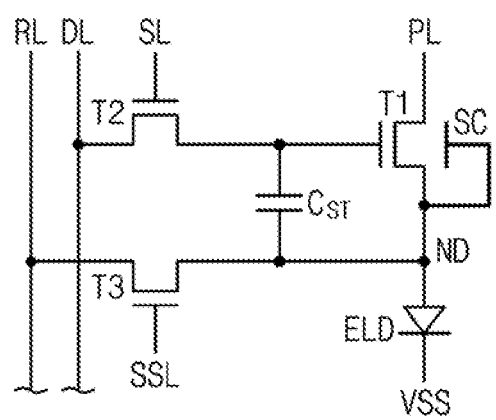
FIG. 2 is an equivalent circuit diagram of a pixel according to an embodiment of the inventive concept.
Figure 3A:
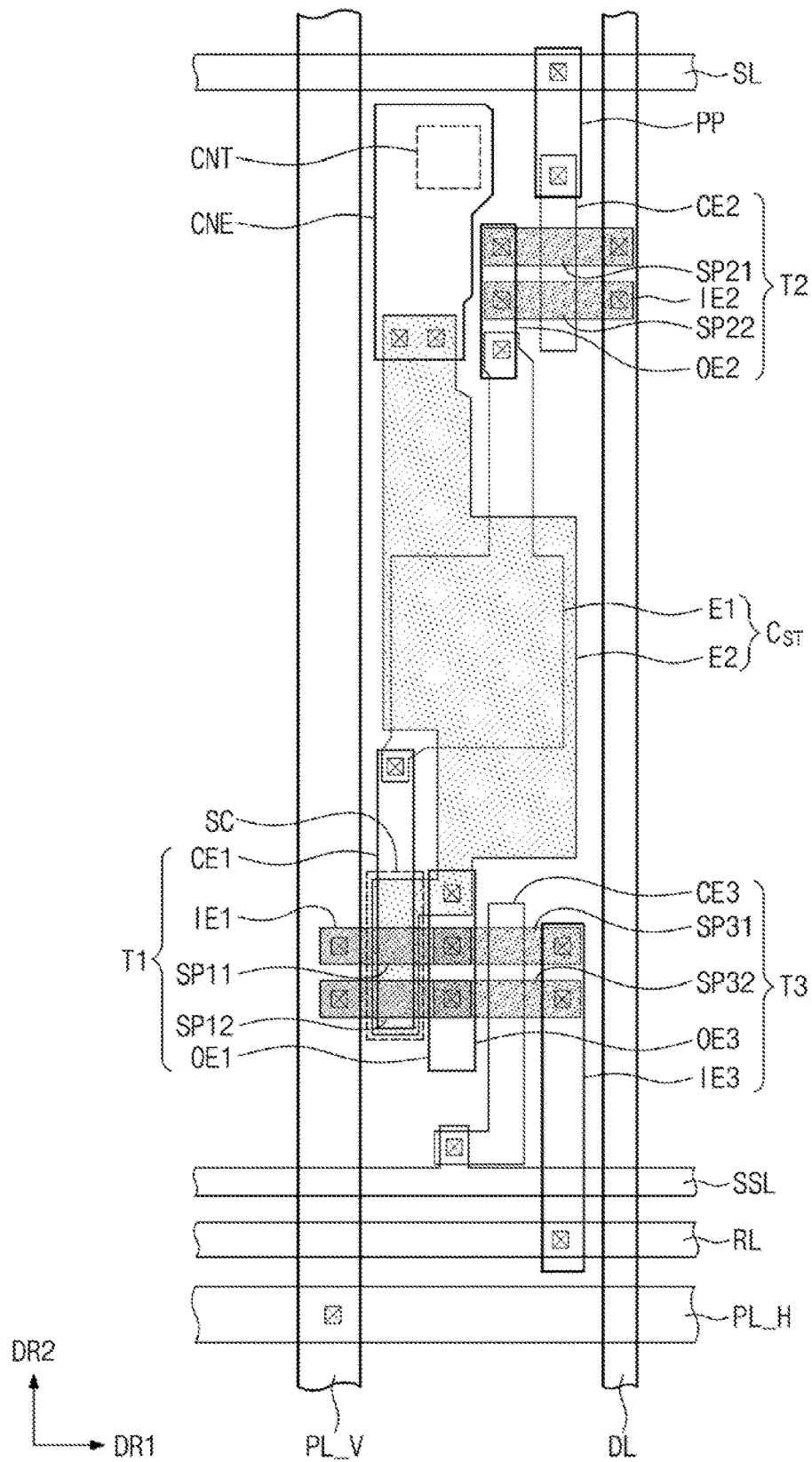
FIG. 3A is a plan view of some elements of a pixel according to an embodiment of the inventive concept.
Figure 3B:
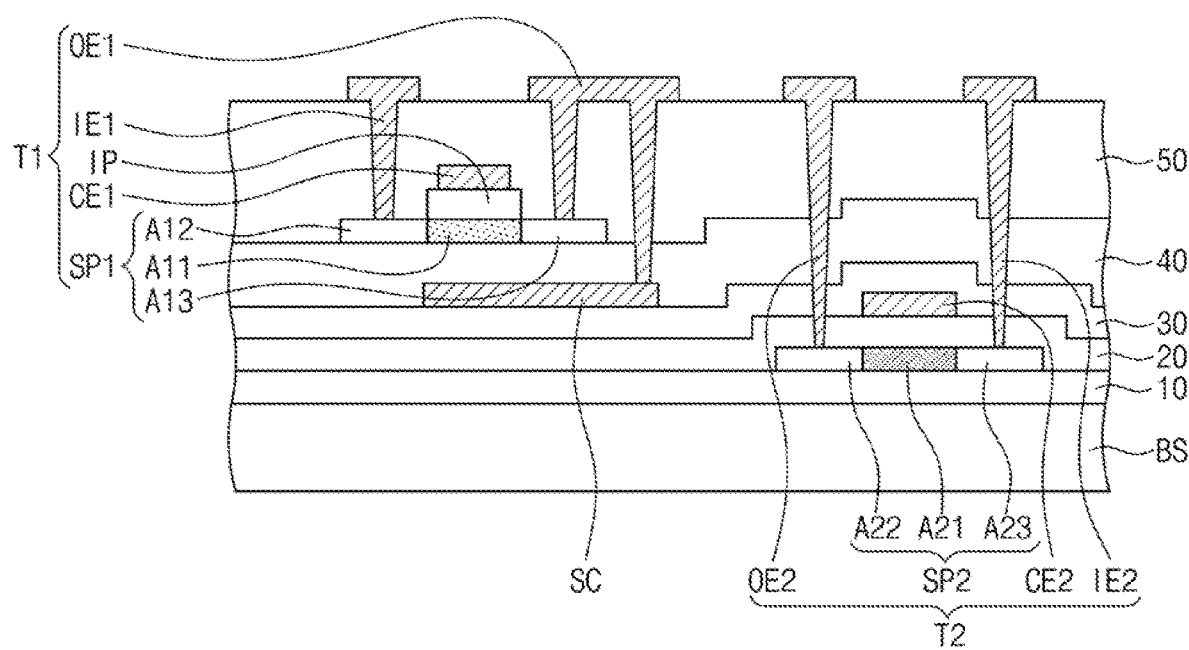
FIG. 3B is a sectional view of some elements shown in FIG. 3A.

FIG. 2 is an equivalent circuit diagram of a pixel according to an embodiment of the inventive concept. FIG. 3A is a plan view of some elements of a pixel according to an embodiment of the inventive concept. FIG. 3B is a sectional view of some elements shown in FIG. 3A. FIG. 2 illustrates an example of a driving circuit for each pixel and that is connected to one of the data lines DL1-DLm (hereinafter, a data line DL), to a corresponding one of the scan lines SL1-SLn (hereinafter, a scan line SL), and to a corresponding one of the emission lines SSL1-SSLn (hereinafter, an emission line SSL).

In a present embodiment, the power line PL includes a horizontal power line PL_H and a vertical power line PL_V. The horizontal power line PL_H extends parallel to the scan line SL, and the vertical power line PL_V extends parallel to the data line DL. The horizontal power line PL_H and the vertical power line PL_V are coupled to each other to transmit substantially the same power voltage.

For convenience in illustration, a light emitting element ELD shown in FIG. 2 is omitted from FIG. 3A, and a first transistor T1 and a second transistor T2 are briefly or partially illustrated in FIG. 3B. Hereinafter, an embodiment of the inventive concept will be described with reference to FIGS. 2, 3A, and 3B.

Referring to FIG. 2, a pixel driving circuit according to an embodiment of the inventive concept includes three thin film transistors T1, T2, and T3 and a capacitor $C_{ST}$. Hereinafter, each of the three thin film transistors T1, T2, and T3 will be assumed to be an n-type thin film transistor. However, embodiments of the pixel driving circuit of FIG. 2 are not limited thereto, and the structure of the pixel driving circuit may be variously modified in other embodiments.

According to an embodiment, the first transistor T1 is connected to the power line PL and the light emitting element ELD. The first transistor T1 is a driving transistor that provides a driving current to the light emitting element ELD.

According to an embodiment, the second transistor T2 is connected to the scan line SL, the data line DL, the first transistor T1, and the capacitor $C_{ST}$. The second transistor T2 is turned-on by a scan signal received through the scan line SL and then transmits a voltage of the data line DL to the capacitor $C_{ST}$ and the first transistor T1. The voltage output from the second transistor T2 controls an amount of charge stored in the capacitor $C_{ST}$ and controls an on/off state of the first transistor T1. In a present embodiment, the second transistor T2 is a switching transistor that controls an on/off state of the pixel PX.

According to an embodiment, the third transistor T3 is connected to the initialization line RL and the emission line SSL. The third transistor T3 is turned-on by an emission control signal received through the emission line SSL and then transmits an initialization voltage received through the initialization line RL to the capacitor $C_{ST}$. The third transistor T3 controls a non-emission period, e.g., a sensing period, of the pixel PX.

According to an embodiment, the capacitor $C_{ST}$ includes a first electrode E1 connected to the third transistor T3 and a second electrode E2 connected to the first transistor T1 and the second transistor T2. The capacitor $C_{ST}$ is charged to store an amount of charge that corresponds to a potential difference between a voltage output from the second transistor T2 and a voltage output from the third transistor T3, or a potential difference between a voltage output from the second transistor T2 and a voltage output from the first transistor T1. A turn-on period of the first transistor T1 is controlled by the capacitor $C_{ST}$ and affects a length of an emission period or a sensing period of the light emitting element ELD.

According to an embodiment, the light emitting element ELD is connected to the third transistor T3, the first transistor T1, and the capacitor $C_{ST}$. The light emitting element ELD includes an electrode connected to the capacitor $C_{ST}$, another electrode that receives the second power voltage VSS, and a light emitting layer between the two electrodes. In the light emitting element ELD, a potential difference between the two electrodes excites the light emitting layer and generates light.

According to an embodiment, the light emitting layer includes an organic material or an inorganic material. For example, the light emitting layer includes a fluorescence organic layer or a phosphorescent organic layer. In an embodiment, the light emitting layer includes a dye or pigment. In an embodiment, the light emitting layer includes an inorganic light emitting layer that contains quantum dots.

According to an embodiment of the inventive concept, the first transistor T1 further includes an additional control electrode SC. The additional control electrode SC is electrically connected to an output node ND to which an output terminal of the first transistor T1 and an output terminal of the third transistor T3 are connected. Thus, the on/off state of the first transistor T1 is controlled by a voltage output from the second transistor T2 and a voltage output from the third transistor T3.

Referring to FIGS. 3A and 3B, according to an embodiment, the display panel DP includes a base substrate BS and a plurality of insulating layers 10, 20, 30, 40, and 50, in addition to the pixels PX. For simplicity of illustration, the light emitting element ELD and the insulating layers 10, 20, 30, 40, and 50 are omitted from FIG. 3A, and the first transistor T1 and the second transistor T2 are briefly or partly illustrated in FIG. 3B. Hereinafter, an embodiment of the inventive concept will be described in more detail with reference to FIGS. 3A and 3B.

According to an embodiment, the second transistor T2 includes second semiconductor patterns SP21 and SP22, a second control electrode CE2, a second input electrode IE2, and a second output electrode OE2. In a present embodiment, the second semiconductor patterns SP21 and SP22 are depicted as two patterns spaced apart from each other. However, embodiments of the inventive concept are not limited to this example, and in other embodiments, the second semiconductor patterns SP21 and SP22 may be provided as a single pattern or as three or more patterns. For simplicity of illustration, one of the plurality of patterns SP21 and SP22, hereinafter, a second semiconductor pattern SP2, is exemplarily illustrated in FIG. 3B.

According to an embodiment, the second semiconductor pattern SP2 is disposed on the base substrate BS. The base substrate BS may be one of a silicon substrate, a plastic substrate, a glass substrate, or an insulating film, but embodiments of the inventive concept are not limited to these examples.

In a present embodiment, the second semiconductor pattern SP2 is disposed on the first insulating layer 10, which is disposed on the base substrate BS. The first insulating layer 10 may include an organic material or an inorganic material. The first insulating layer 10 may include a buffer layer or a barrier layer and may have a single- or multi-layered structure.

According to an embodiment, the second semiconductor pattern SP2 includes a crystalline semiconductor material. For example, the second semiconductor pattern SP2 includes a polycrystalline semiconductor material, such as poly silicon.

According to an embodiment, the second semiconductor pattern SP2 includes a channel region A21, an input region A22, and an output region A23. The channel region A21 of the second semiconductor pattern SP2 overlaps the second control electrode CE2.

According to an embodiment, the second control electrode CE2 is disposed on the second insulating layer 20. The second insulating layer 20 is disposed on the first insulating layer 10 and covers the second semiconductor pattern SP2. The second insulating layer 20 may include an organic layer or an inorganic layer. In a present embodiment, the second insulating layer 20 is formed of or includes at least one of silicon oxide, silicon nitride, or any combination thereof, but embodiments of the inventive concept are not limited to these examples.

According to an embodiment, the second control electrode CE2 receives a gate signal through the scan line SL. In a present embodiment, the second control electrode CE2 is disposed on a different layer from the scan line SL. Thus, the second control electrode CE2 is connected to the scan line SL through a connection pattern PP.

According to an embodiment, the scan line SL is disposed between the third insulating layer 30 and the fourth insulating layer 40, and the connection pattern PP is disposed on the fifth insulating layer 50. The connection pattern PP, which extends in the second direction DR2 as shown in FIG. 3A, penetrates at least a portion of the insulating layers 30, 40, and 50 and is coupled to the second control electrode CE2 and the scan line SL.

According to an embodiment, the second input electrode IE2 is disposed on the fifth insulating layer 50. The second input electrode IE2 penetrates the fifth, fourth, third and second insulating layers 50, 40, 30 and 20 and is coupled to the input region A22 of the second semiconductor pattern SP2. In a present embodiment, the second input electrode IE2 corresponds to a portion of the data line DL, which is coupled to the second semiconductor patterns SP21 and SP22. Accordingly, the second input electrode IE2 receives a data voltage through the data line DL.

According to an embodiment, the second output electrode OE2 is disposed on the fifth insulating layer 50. The second output electrode OE2 is spaced apart from the second input electrode IE2, penetrates the fifth, fourth, third and second insulating layers 50, 40, 30 and 20 and is coupled to the output region A23 of the second semiconductor pattern SP2. In a present embodiment, the second output electrode OE2 is connected to the capacitor $C_{ST}$. The second output electrode OE2 is coupled to the first electrode E1 of the capacitor $C_{ST}$.

According to an embodiment, the first transistor T1 includes first semiconductor patterns SP11 and SP12, a first control electrode CE1, a first input electrode IE1, and a first output electrode OE1. In a present embodiment, the first semiconductor patterns SP11 and SP12 are depicted as two patterns spaced apart from each other.

However, embodiments of the inventive concept are not limited to this example, and in other embodiments, the first semiconductor patterns SP11 and SP12 may be provided as a single pattern or as three or more patterns. For simplicity of illustration, one of the plurality of patterns SP11 and SP12, hereinafter, a first semiconductor pattern SP1, is exemplarily illustrated in FIG. 3B.

According to an embodiment, the first semiconductor pattern SP1 is be disposed on a different layer from the second semiconductor pattern SP2. In a present embodiment, the first semiconductor pattern SP1 is disposed between the fourth insulating layer 40 and the fifth insulating layer 50, as shown.

According to an embodiment, the first semiconductor pattern SP1 includes a semiconductor material. In a present embodiment, the first semiconductor pattern SP1 includes an oxide semiconductor. For example, the oxide semiconductor may be a metal oxide whose metallic element is at least one of zinc (Zn), indium (In), gallium (Ga), tin (Sn), or titanium (Ti), or may include mixtures of zinc (Zn), indium (In), gallium (Ga), tin (Sn), or titanium (Ti) and oxides thereof.

According to an embodiment, the first semiconductor pattern SP1 includes a channel region A11, an input region A12, and an output region A13. The channel region A11 of the first semiconductor pattern SP1 overlaps the first control electrode CE1.

According to an embodiment, the first control electrode CE1 is disposed on the first semiconductor pattern SP1. In a present embodiment, the first control electrode CE1 is disposed on an insulating pattern IP. The insulating pattern IP is disposed on the first semiconductor pattern SP1 and under the first control electrode CE1, covers the channel region A11 and exposes the input region A12 and the output region A13. However, embodiments of the inventive concept are not limited to this example, and in other embodiments, the insulating pattern IP is provided as an insulating layer formed on substantially the entire top surface of the fourth insulating layer 40.

According to an embodiment, the first control electrode CE1 extends in a direction that crosses and overlaps the first semiconductor patterns SP11 and SP12 when viewed in a plan view. The first control electrode CE1 is connected to the capacitor $C_{ST}$. In a present embodiment, the first control electrode CE1 is coupled to the first electrode E1 of the capacitor $C_{ST}$. The first control electrode CE1 is controlled by a signal received from the second transistor T2 through the first electrode E1.

According to an embodiment, the first input electrode IE1 and the first output electrode OE1 are disposed on the fifth insulating layer 50. The first input electrode IE1 and the first output electrode OE1 penetrate the fifth insulating layer 50 and are respectively connected to the input region A12 and the output region A13 of the first semiconductor pattern SP1.

In a present embodiment, the first input electrode IE1 corresponds to a portion of the vertical power line PL_V, which is coupled to a portion of the first semiconductor patterns SP11 and SP12. The vertical power line PL_V is disposed on the same layer as the data line DL and is disposed on the fifth insulating layer 50.

According to an embodiment, the first input electrode IE1 receives the first power voltage VDD through the vertical power line PL_V. However, embodiments of the inventive concept are not limited to this example, and in other embodiments, the first input electrode IE1 is a separate pattern disposed on a different layer from the vertical power line PL_V, penetrates an insulating layer and is coupled to the vertical power line PL_V.

According to an embodiment, the first output electrode OE1 is connected to the capacitor $C_{ST}$. In a present embodiment, the first output electrode OE1 is coupled to the second electrode E2 of the capacitor $C_{ST}$. The first output electrode OE1 is disposed on a different layer from the second electrode E2 and is coupled to the second electrode E2 through a contact hole.

According to an embodiment, the third transistor T3 includes third semiconductor patterns SP31 and SP32, a third control electrode CE3, a third input electrode IE3, and a third output electrode OE3. In a present embodiment, the third semiconductor patterns SP31 and SP32 are depicted as two patterns spaced apart from each other. However, embodiments of the inventive concept are not limited to this example, and in other embodiments, the third semiconductor patterns SP31 and SP32 may be provided as a single pattern or as three or more patterns.

According to an embodiment, the third semiconductor patterns SP31 and SP32 include a crystalline semiconductor material. For example, the third semiconductor patterns SP31 and SP32 include a polycrystalline semiconductor material, such as poly silicon. The third semiconductor patterns SP31 and SP32 are disposed on the same layer as the second semiconductor pattern SP2 and are formed of the same material as the second semiconductor pattern SP2. Thus, the third semiconductor patterns SP31 and SP32 and the second semiconductor pattern SP2 can be simultaneously formed using a single mask. However, embodiments of the inventive concept are not limited to this example, and in other embodiments, the third semiconductor patterns SP31 and SP32 may be disposed on a different layer from the second semiconductor pattern SP2 or may be formed of a different material from the second semiconductor pattern SP2.

According to an embodiment, the third control electrode CE3 extends in a direction that crosses and overlaps the third semiconductor patterns SP31 and SP32, when viewed in a plan view. A channel region that overlaps the third control electrode CE3 is formed in each of the third semiconductor patterns SP31 and SP32.

According to an embodiment, the third control electrode CE3 is connected to the emission line SSL. Thus, an on/off state of the third transistor T3 is controlled by a signal received from the emission line SSL.

In a present embodiment, the third control electrode CE3 is disposed on a different layer from the emission line SSL. For example, the third control electrode CE3 is disposed on the same layer as the first electrode E1, and the emission line SSL is disposed on the same layer as the second electrode E2. Thus, the third control electrode CE3 is coupled to the emission line SSL through a contact hole.

According to an embodiment, the third input electrode IE3 is coupled to portions of the third semiconductor patterns SP31 and SP32. The third input electrode IE3 is coupled to the initialization line RL. Accordingly, the third input electrode IE3 receives the initialization voltage through the initialization line RL.

In a present embodiment, the third input electrode IE3 is disposed on a different layer from the initialization line RL. For example, the third input electrode IE3 is disposed on the same layer as the data line DL, and the initialization line RL is disposed on the same layer as the second electrode E2. Thus, the third input electrode IE3 is coupled to the initialization line RL through a contact hole.

According to an embodiment, the third output electrode OE3 is spaced apart from the third input electrode IE3 and is coupled to other portions of the third semiconductor patterns SP31 and SP32. The third output electrode OE3 and the third input electrode IE3 are disposed on the same layer.

In a present embodiment, the third output electrode OE3 and the first output electrode OE1 are provided as a single or same pattern. However, embodiments of the inventive concept are not limited to this example, and in other embodiments, the third output electrode OE3 is formed as a separate pattern different from or independent of the first output electrode OE1 but that receives the same electrical signal as the first output electrode OE1.

According to an embodiment, the third output electrode OE3 is coupled to the second electrode E2 of the capacitor $C_{ST}$ through a contact hole. Thus, an electric potential of the second electrode E2 of the capacitor $C_{ST}$ is controlled by each of the first transistor T1 and the third transistor T3.

According to an embodiment, the capacitor $C_{ST}$ includes the first electrode E1 and the second electrode E2, which are disposed on different layers. As described above, the first electrode E1 is disposed on the same layer as the second control electrode CE2. In other words, the first electrode E1 is disposed between the second insulating layer 20 and the third insulating layer 30. In addition, the second electrode E2 is disposed between the third insulating layer 30 and the fourth insulating layer 40.

According to an embodiment, the first electrode E1 is coupled to each of the first control electrode CE1 and the second output electrode OE2, and the second electrode E2 is coupled to each of the third output electrode OE3 and the first output electrode OE1. In addition, the light emitting element ELD is coupled to the capacitor $C_{ST}$ through a connection electrode CNE. For convenience of illustration, a dotted line is used to show a position or shape of a contact hole CNT to which the light emitting element ELD is coupled.

In a present embodiment, the second electrode E2 overlaps the first electrode E1 and the first semiconductor patterns SP11 and SP12, when viewed in a plan view. For simplicity of illustration, the second electrode E2 is depicted as a shaded pattern. The second electrode E2 includes a first portion that overlaps the first electrode E1 to form the capacitor $C_{ST}$, and a second portion that overlaps the first semiconductor patterns SP11 and SP12 to form the additional control electrode SC.

According to an embodiment, the second portion extends in a direction parallel to a portion of the first control electrode CE1 and crosses the first semiconductor patterns SP11 and SP12, and thus, the second portion can function as the additional control electrode SC. The additional control electrode SC and the second electrode E2 are disposed on the same layer. For example, the additional control electrode SC is disposed between the third insulating layer 30 and the fourth insulating layer 40.

According to an embodiment, the additional control electrode SC overlaps at least a portion of the first semiconductor pattern SP1 and overlaps the first control electrode CE1, when viewed in a plan view. The additional control electrode SC overlaps the channel region A11 of the first semiconductor pattern SP1. In other words, the channel region A11 is disposed between the first control electrode CE1 and the additional control electrode SC and overlaps each of the first control electrode CE1 and the additional control electrode SC, when viewed in a plan view.

According to an embodiment, the additional control electrode SC is connected to the first output electrode OE1. In a present embodiment, the first output electrode OE1 penetrates the fourth insulating layer 40 and the fifth insulating layer 50 and is coupled to the additional control electrode SC. Thus, the additional control electrode SC has the same electric potential as the first output electrode OE1.

In a present embodiment, the first portion and the second portion of the second electrode E2 are connected to each other and have substantially the same electric potential. The first portion and the second portion have an electric potential that corresponds to an electric potential of the output node ND.

According to an embodiment of the inventive concept, since the additional control electrode SC is further provided in the first transistor T1, an on/off state of the first transistor T1 is controlled by a voltage that corresponds to the electric potential of the output node ND, and thus, output synchronization of the first transistor T1 can be quickly achieved. Accordingly, electric characteristics of the pixel PX may be improved.

In an embodiment, the first portion and the second portion of the second electrode E2 are connected to each other to form a single body. In other words, the capacitor $C_{ST}$ and the additional control electrode SC are formed by the second electrode E2, which is substantially a single pattern. Thus, an integration density of the pixel may be improved.

According to an embodiment of the inventive concept, by changing the shape of the second electrode E2, the second electrode E2 and the additional control electrode SC can be simultaneously formed using a single mask. Accordingly, it is possible to omit an additional process of forming the additional control electrode SC, and thus, the overall process can be simplified and the process cost can be reduced.

Figure 4A:
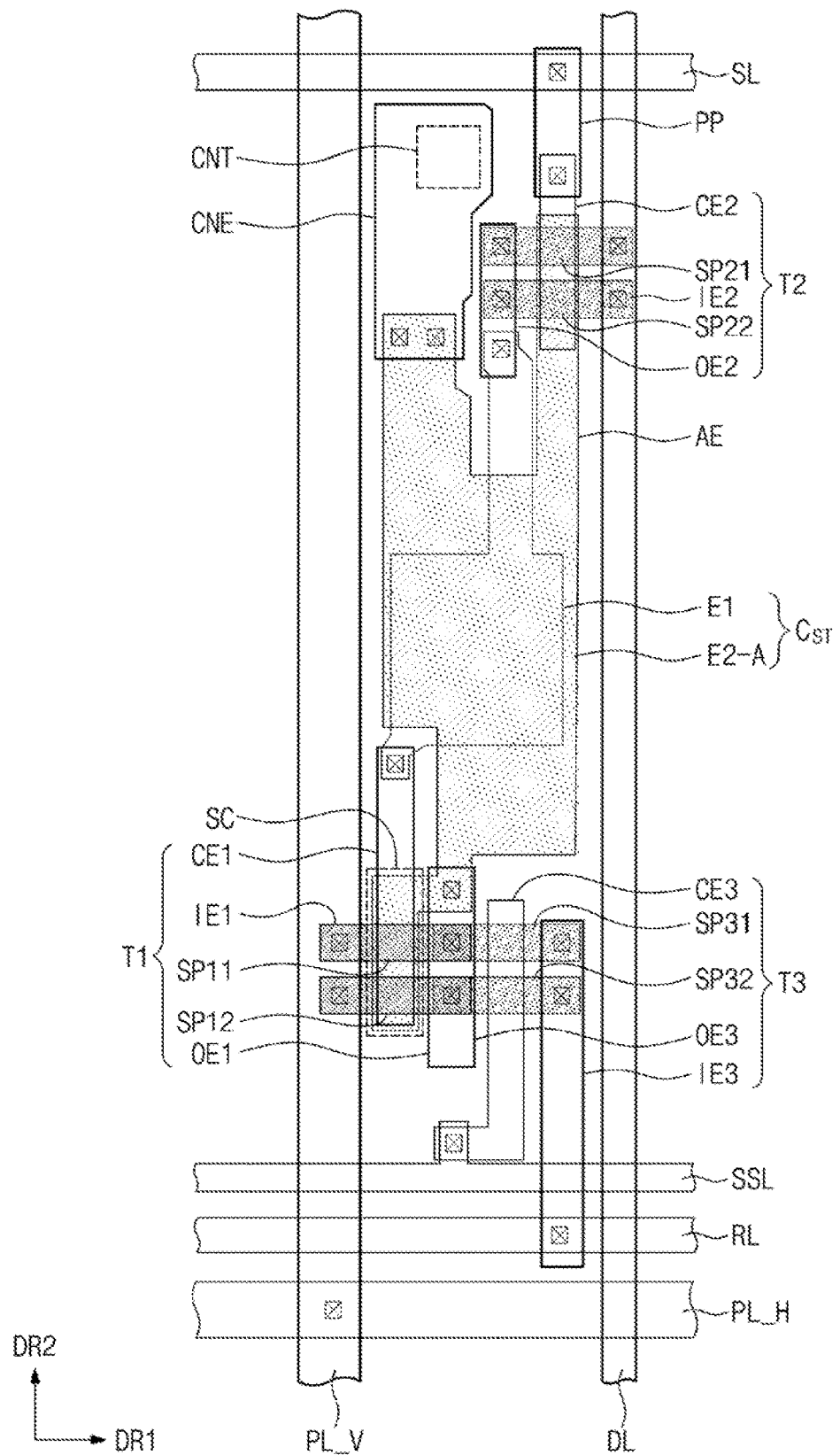
FIG. 4A is a plan view of some elements of a pixel according to an embodiment of the inventive concept.
Figure 4B:
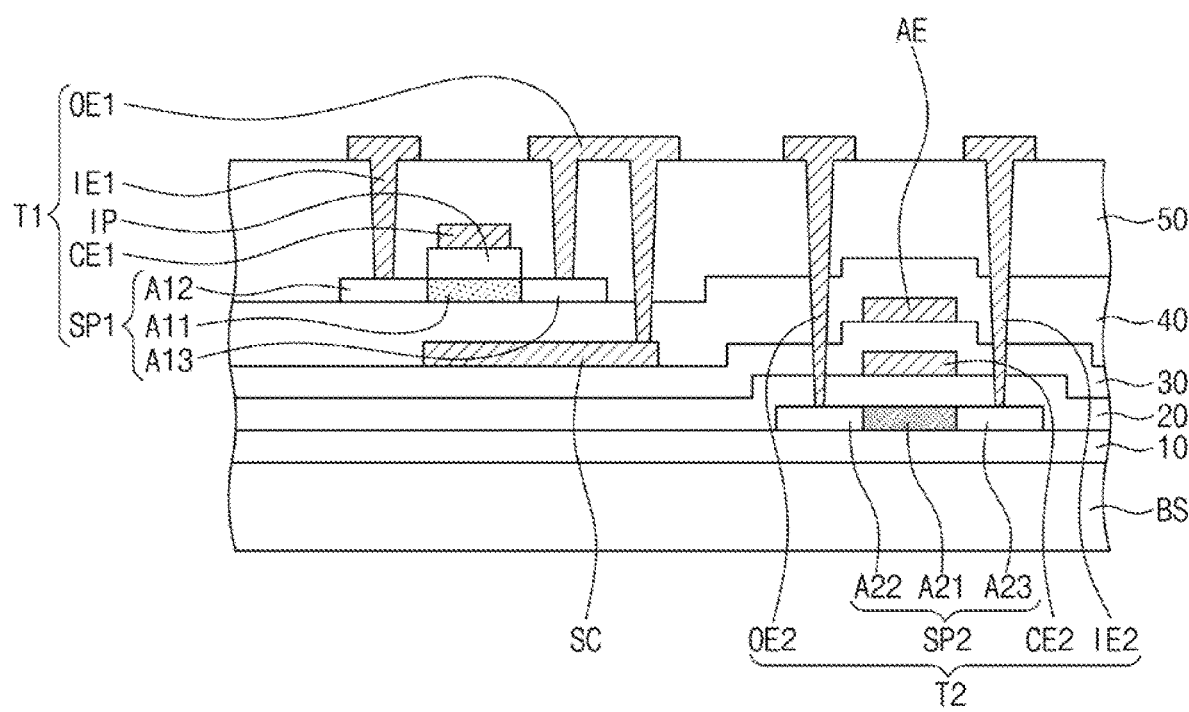
FIG. 4B is a sectional view of some elements shown in FIG. 4A.

FIG. 4A is a plan view of some elements of a pixel according to an embodiment of the inventive concept. FIG. 4B is a sectional view of some elements shown in FIG. 4A. FIG. 4A illustrates a region that corresponds to FIG. 3A, and FIG. 4B illustrates a region that corresponds to FIG. 3B. Hereinafter, an embodiment of the inventive concept will be described with reference to FIGS. 4A and 4B. For concise description, an element previously described with reference to FIGS. 1, 2, 3A, and 3B may be identified by the same reference number without repeating an overlapping description thereof.

As shown in FIGS. 4A and 4B, according to an embodiment, a display panel DP-A further includes an upper electrode AE that overlaps the second transistor T2. The upper electrode AE is disposed between the third insulating layer 30 and the fourth insulating layer 40. The upper electrode AE and a second electrode E2-A are disposed on the same layer.

In a present embodiment, the upper electrode AE and the second electrode E2-A form a single body pattern. The second electrode E2-A is a portion of the single body pattern, which overlaps the first electrode E1 to constitute the capacitor $C_{ST}$. The upper electrode AE is another portion of the single body pattern, which extends to a region that overlaps the second semiconductor patterns SP21 and SP22 and overlaps the second control electrode CE2. The upper electrode AE is disposed on the same layer as the additional control electrode SC.

According to an embodiment, the upper electrode AE and the second control electrode CE2 form a capacitor. However, embodiments of the inventive concept are not limited to this example, and in other embodiments, the upper electrode AE and the second electrode E2-A are formed as separate patterns but are electrically connected to each other through an additional connection electrode.

Figure 5:
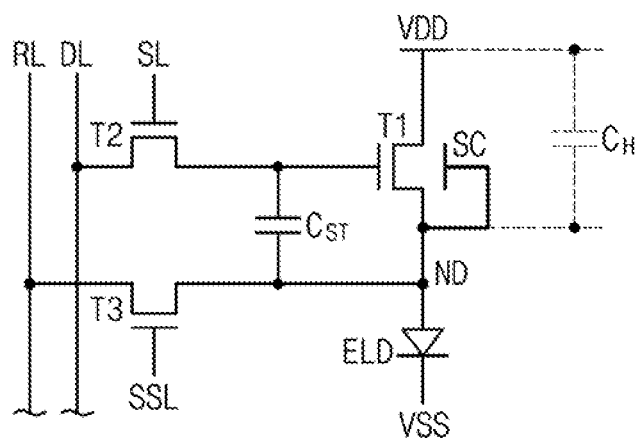
FIG. 5 is an equivalent circuit diagram of a pixel according to an embodiment of the inventive concept.
Figure 6A:
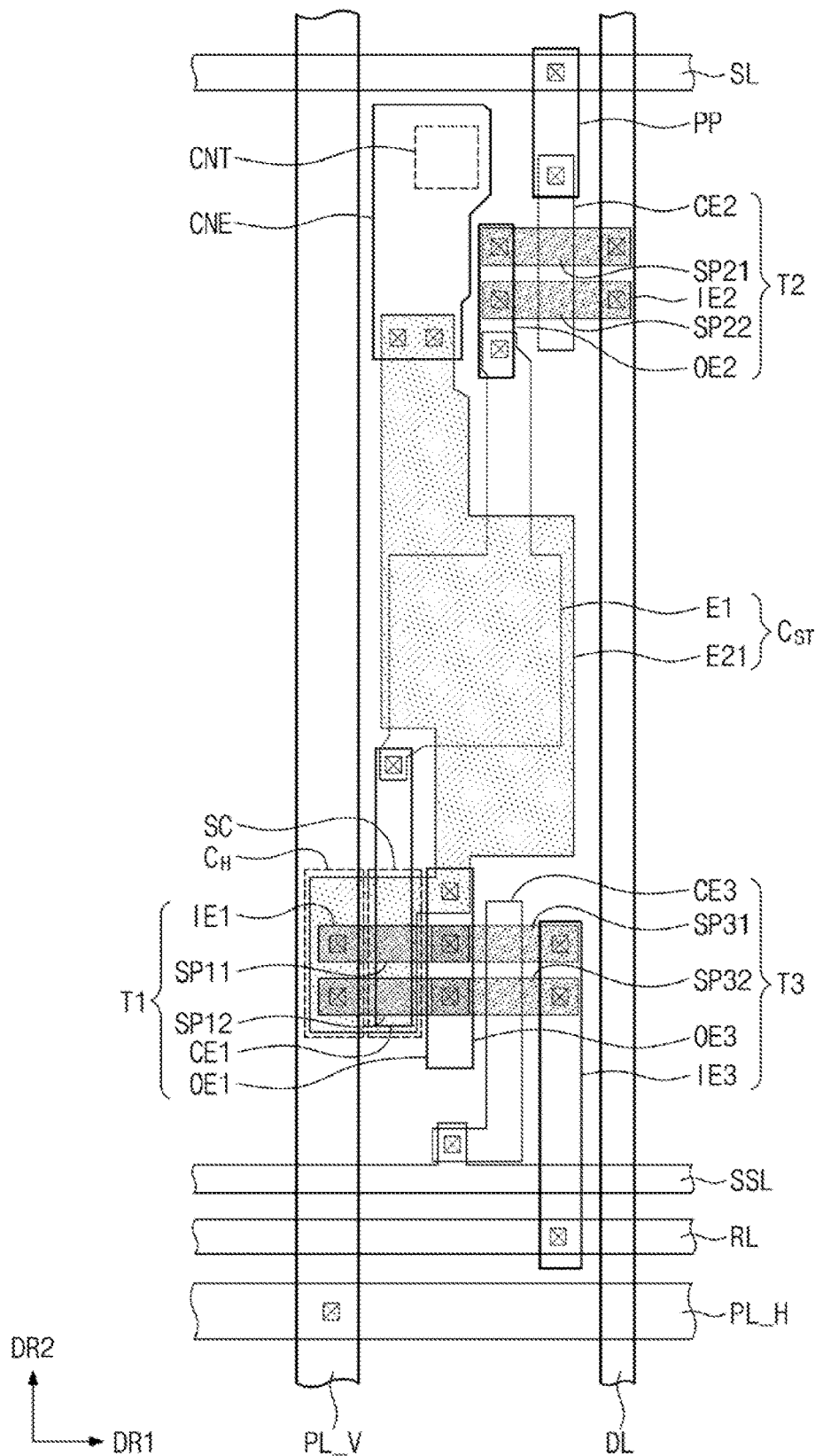
FIG. 6A is a plan view of some elements of a pixel according to an embodiment of the inventive concept.
Figure 6B:
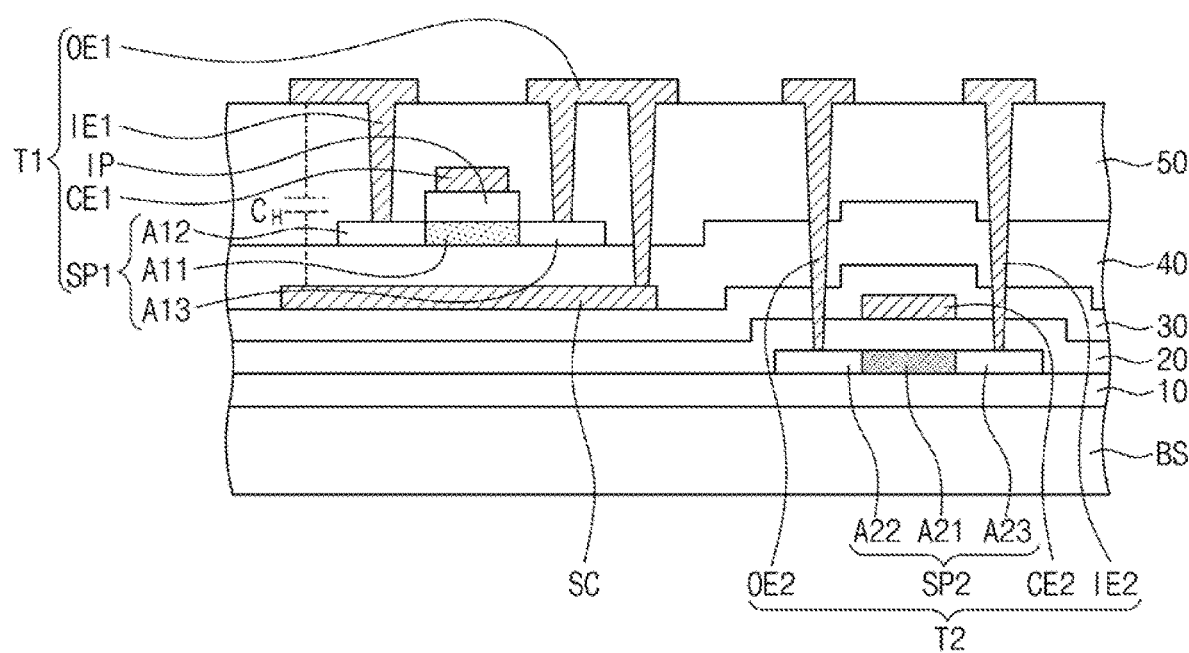
FIG. 6B is a sectional view of some elements shown in FIG. 6A.

FIG. 5 is an equivalent circuit diagram of a pixel according to an embodiment of the inventive concept. FIG. 6A is a plan view of some elements of a pixel according to an embodiment of the inventive concept. FIG. 6B is a sectional view of some elements shown in FIG. 6A. For convenience in description, FIG. 5A illustrates a region that corresponds to FIG. 3A, and FIG. 5B illustrates a region that corresponds to FIG. 3B.

Hereinafter, an embodiment of the inventive concept will be described with reference to FIGS. 5, 6A, and 6B. For concise description, an element previously described with reference to FIGS. 1, 2, 3A, 3B, 4A, and 4B may be identified by the same reference number without repeating an overlapping description thereof.

According to an embodiment, the pixel of FIG. 5 corresponds to a pixel of FIG. 2, except for addition of a first capacitor $C_H$. The first capacitor $C_H$, is formed between the input and output terminals of the first transistor TL. For example, capacitance of the first capacitor $C_H$ is determined by a difference between the first power voltage VDD and an electric potential of the output node ND.

Referring to FIGS. 6A and 6B, according to an embodiment, a second electrode E21 overlaps the first electrode E1, the first semiconductor patterns SP11 and SP12, and the vertical power line PL_V, when viewed in a plan view. For convenience of description, the second electrode E21 is depicted as a shaded pattern.

According to an embodiment, the second electrode E21 includes a first portion that overlaps the first electrode E1 to form the capacitor $C_{ST}$, a second portion that overlaps the first semiconductor patterns SP11 and SP12 and forms the additional control electrode SC, and a third portion that overlaps the vertical power line PL_V to form the first capacitor $C_H$.

In a present embodiment, the first to third portions are connected to each other and have substantially the same electric potential. The first to third portions have an electric potential that corresponds to the electric potential of the output node ND. For convenience of illustration, in FIG. 6B, the first capacitor $C_H$ is illustrated between the additional control electrode SC that has the same electric potential as the third portion and the first input electrode IE1 that has the same electric potential as the vertical power line PL_V.

According to an embodiment, the first capacitor $C_H$ allows a light emission current to be stably supplied to the light emitting element ELD through the first transistor T1. The first capacitor $C_H$ is formed between an electrode of the light emitting element ELD, which is connected to the output node ND, and the first power voltage VDD.

According to an embodiment, as the capacitance of the first capacitor $C_H$ increase, a change in voltage of the first control electrode CE1 of the first transistor T1 is affected by a change in voltage of the output node ND. Thus, a potential difference Vgs between the output and control electrodes of the first transistor T1 can be more stably maintained, and, thus, the light emission operation of the light emitting element ELD can be more stably performed.

According to an embodiment of the inventive concept, an area of the additional control electrode SC that overlaps the first transistor T1 can be increased such that the additional control electrode SC overlaps the first input electrode IE1, and thus, the first capacitor $C_H$ is formed with the fourth insulating layer 40 and the fifth insulating layer 50 interposed therebetween. That is, according to an embodiment of the inventive concept, one metal pattern is used in common for two capacitors $C_H$ and $C_{ST}$ and the first transistor T1 with a plurality of control electrodes.

According to an embodiment, the first to third portions of the second electrode E21 are connected to each other to form a single body. In other words, the capacitor $C_{ST}$, the additional control electrode SC, and the first capacitor $C_H$ can be formed by the second electrode E21, which is substantially a single electrode.

According to an embodiment of the inventive concept, by changing the shape of the second electrode E21, one electrode of the capacitor $C_{ST}$, the additional control electrode SC, and one electrode of the first capacitor $C_H$ can be simultaneously formed using a single mask. Thus, an additional process of forming the additional control electrode SC or the first capacitor $C_H$ can be omitted, and thus, the overall process can be simplified and the process cost can be reduced.

Figure 7:
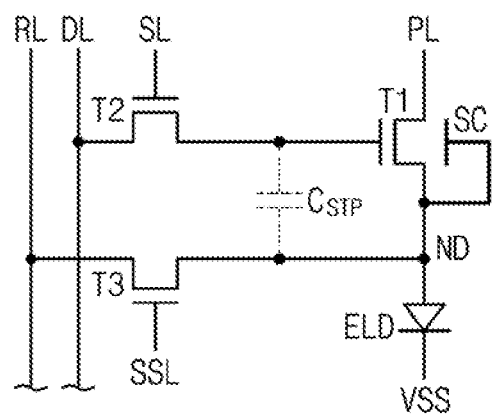
FIG. 7 is an equivalent circuit diagram of a pixel according to an embodiment of the inventive concept.
Figure 8A:
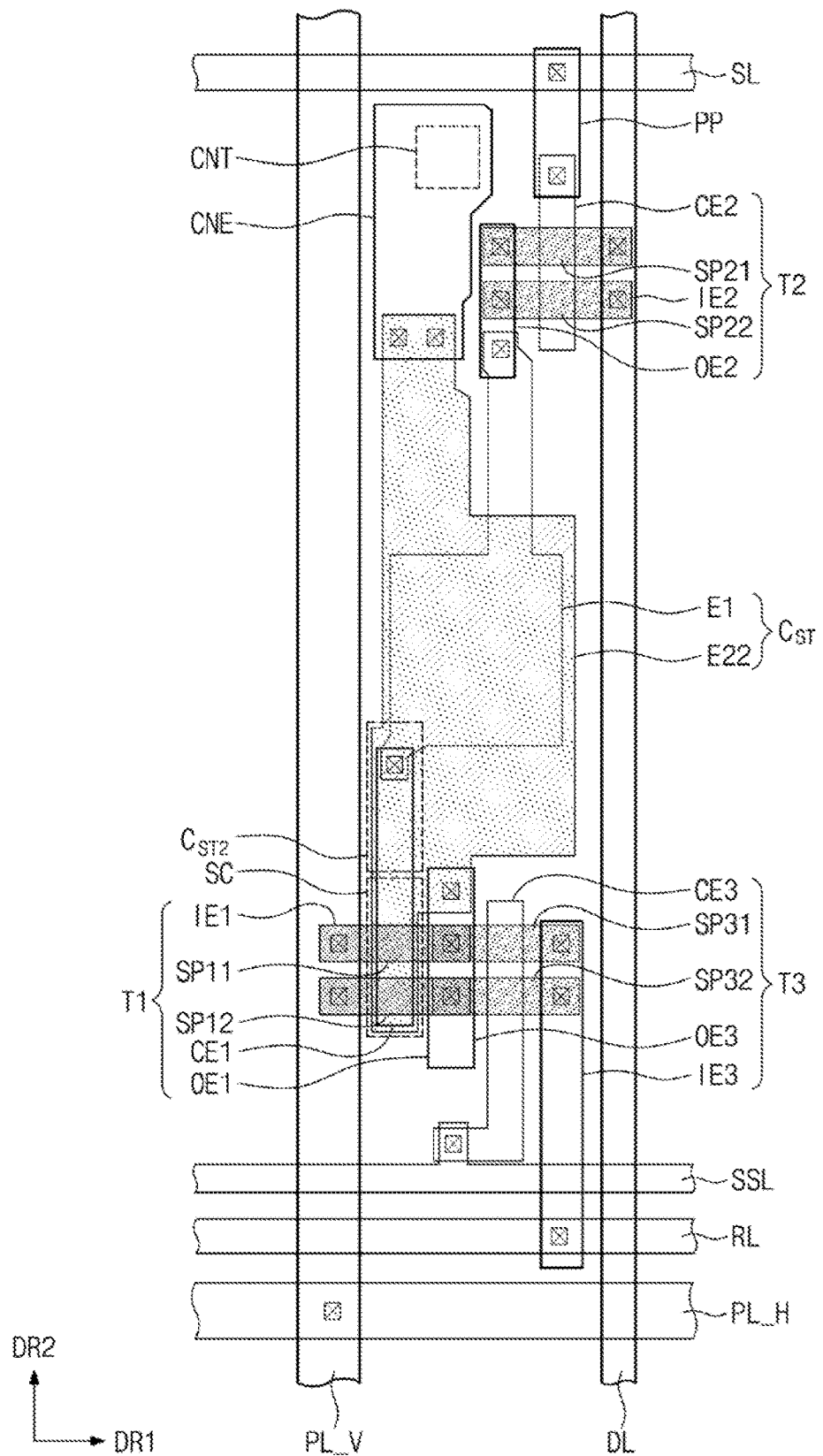
FIG. 8A is a plan view of some elements of a pixel according to an embodiment of the inventive concept.
Figure 8B:
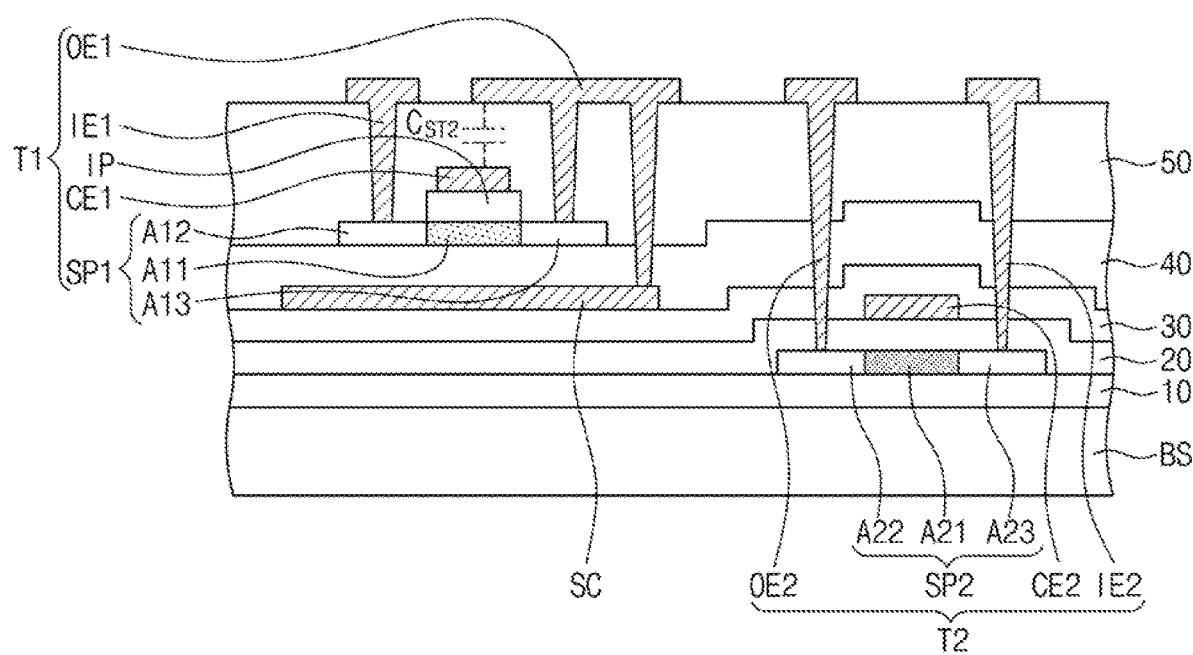
FIG. 8B is a sectional view of some elements shown in FIG. 8A.

FIG. 7 is an equivalent circuit diagram of a pixel according to an embodiment of the inventive concept. FIG. 8A is a plan view of some elements of a pixel according to an embodiment of the inventive concept. FIG. 8B is a sectional view of some elements shown in FIG. 8A. For convenience of description, FIG. 8A illustrates a region that corresponds to FIG. 3A, and FIG. 8B illustrates a region that corresponds to FIG. 3B. Hereinafter, an embodiment of the inventive concept will be described with reference to FIGS. 7, 8A, and 8B. For concise description, an element previously described with reference to FIGS. 1 to 6B may be identified by the same reference number without repeating an overlapping description thereof.

Referring to FIGS. 7 to 8B, according to an embodiment, except for the capacitor $C_{STP}$, the pixel corresponds to a pixel of FIG. 2. The capacitor $C_{STP}$ includes a second capacitor $C_{ST2}$ and a third capacitor $C_{ST}$. A capacitance of the capacitor $C_{STP}$ is a sum of a capacitance of the second capacitor $C_{ST2}$ and a capacitance of the third capacitor $C_{ST}$. The third capacitor $C_{ST}$ corresponds to the capacitor $C_{ST}$ shown in FIG. 2. In other words, the third capacitor $C_{ST}$ is formed by the first electrode E1 and a second electrode E22.

In a present embodiment, the second electrode E22 overlaps the entirety of the first control electrode CE1, in addition to the first electrode E1. The second electrode E22 includes a first portion that overlaps the first electrode E1 to form the third capacitor $C_{ST}$, a second portion that overlaps the first semiconductor patterns SP11 and SP12 and the first control electrode CE1 and forms the additional control electrode SC, and a third portion spaced apart from the first semiconductor patterns SP11 and SP12 in a plan view and that overlaps with the first control electrode CE1 to form the second capacitor $C_{ST2}$.

In a present embodiment, the first to third portions are connected to each other and have substantially the same electric potential. The first to third portions have an electric potential that corresponds to the electric potential of the output node ND.

In FIG. 8B, according to an embodiment, to reduce complexity of illustration, the second capacitor $C_{ST2}$ is illustrated between the first output electrode OE1, which has substantially the same electric potential as the second electrode E22, and the first control electrode CE1. The first output electrode OE1 is coupled to the additional control electrode SC, and the additional control electrode SC has the same electric potential as the second electrode E22.

According to an embodiment, the capacitor $C_{ST}$ is formed by the second electrode E22 and a metal pattern that overlaps the second electrode E22. The capacitor $C_{STP}$ includes not only the third capacitor $C_{ST}$ between the second electrode E22 and the first electrode E1 but also the second capacitor $C_{ST2}$ between the second electrode E22 and the first control electrode CE1. Thus, the capacitor $C_{STP}$ has a larger capacitance than that of the capacitor $C_{ST}$ shown in FIG. 2, and this can improve display characteristics of the pixel.

In a present embodiment, the first to third portions are connected to each other to form a single body. In other words, the second capacitor $C_{ST2}$, the third capacitor $C_{ST}$, and the additional control electrode SC can be formed by the second electrode E22, which is substantially a single pattern. According to an embodiment of the inventive concept, by changing the shape of the second electrode E22, it is possible to control the capacitance of the capacitor $C_{STP}$ and realize a dual gate structure of the first transistor T1. Thus, an overall manufacturing process can be simplified and the process cost can be reduced.

Figure 9:
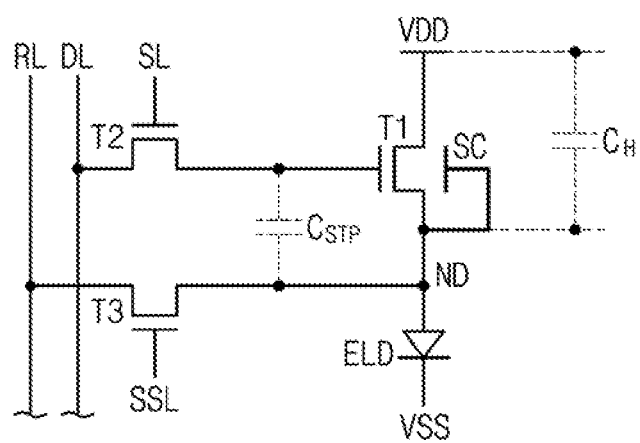
FIG. 9 is an equivalent circuit diagram of a pixel according to an embodiment of the inventive concept.
Figure 10A:
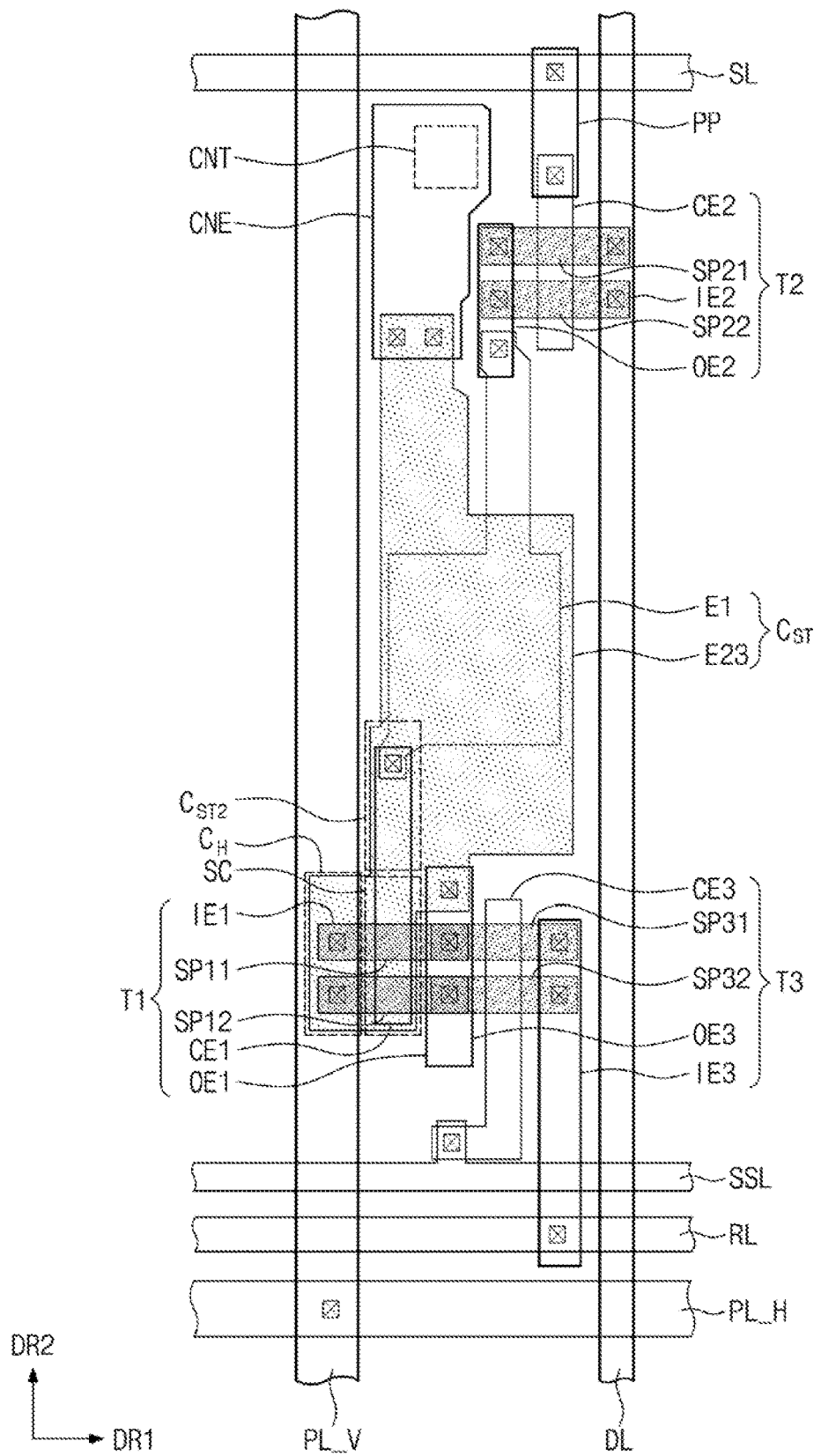
FIG. 10A is a plan view of some elements of a pixel according to an embodiment of the inventive concept.
Figure 10B:
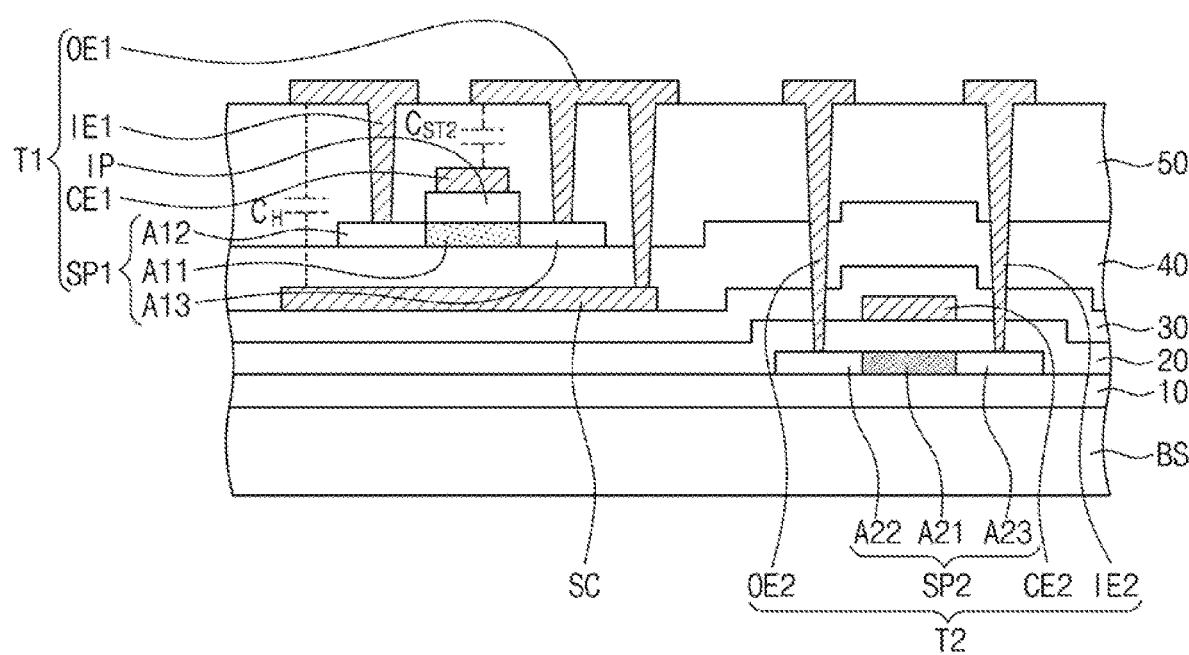
FIG. 10B is a sectional view of some elements shown in FIG. 10A.

FIG. 9 is an equivalent circuit diagram of a pixel according to an embodiment of the inventive concept. FIG. 10A is a plan view of some elements of a pixel according to an embodiment of the inventive concept. FIG. 10B is a sectional view of some elements shown in FIG. 10A. For convenience in description, FIG. 10A illustrates a region that corresponds to FIG. 3A, and FIG. 9B illustrates a region that corresponds to FIG. 3B.

Hereinafter, an embodiment of the inventive concept will be described with reference to FIGS. 9, 10A, and 10B. For concise description, an element previously described with reference to FIGS. 1 to 8B may be identified by the same reference number without repeating an overlapping description thereof.

As shown in FIG. 9, according to an embodiment, the pixel corresponds to the pixel of FIG. 2, except for the capacitor $C_{STP}$, the first capacitor $C_H$, and the additional control electrode SC. The capacitor $C_{STP}$ corresponds to the capacitor $C_{STP}$ shown in FIG. 6. The first capacitor $C_H$ corresponds to the first capacitor $C_H$ shown in FIG. 5, and the additional control electrode SC corresponds to the additional control electrode SC shown in FIG. 2.

Referring to FIGS. 10A and 10B, according to an embodiment, a second electrode E23 overlaps the first electrode E1, the first semiconductor patterns SP11 and SP12, the vertical power line PL_V, and the first control electrode CE1, when viewed in a plan view. For convenience of description, the second electrode E23 is depicted as a shaded pattern.

According to an embodiment, the second electrode E23 includes a first portion that overlaps the first electrode E1 to form the capacitor $C_{ST}$, a second portion that overlaps the first semiconductor patterns SP11 and SP12 and forms the additional control electrode SC, a third portion that overlaps the vertical power line PL_V to form the first capacitor $C_H$, and a fourth portion spaced apart from the first semiconductor patterns SP11 and SP12 in a plan view and that overlaps the first control electrode CE1 to form the second capacitor $C_{ST2}$.

In a present embodiment, the first to fourth portions are connected to each other to have substantially the same electric potential. The first to fourth portions have an electric potential that corresponds to the electric potential of the output node ND.

In FIG. 10B, according to an embodiment, to reduce complexity of illustration, the first capacitor $C_H$ is illustrated between the first input electrode IE1, which has substantially the same electric potential as the vertical power line PL_V, and the additional control electrode SC, and the second capacitor $C_{ST2}$ is illustrated between the first output electrode OE1, which has substantially the same electric potential as the second electrode E23, and the first control electrode CE1. According to an embodiment of the inventive concept, each of the capacitor $C_{STP}$, the additional control electrode SC, and the first capacitor $C_H$ are provided in each pixel, and thus, it is possible to improve display characteristics of the pixel.

In an embodiment, the first to fourth portions are connected to each other to form a single body. In other words, the first capacitor $C_H$, the second capacitor $C_{ST2}$, the third capacitor $C_{ST}$, and the additional control electrode SC are formed by the second electrode E23, which is substantially a single pattern. According to an embodiment of the inventive concept, by changing the shape of the second electrode E23, it is possible to control the capacitance of the capacitor $C_{STP}$, to form the first capacitor $C_H$ additionally, and to realize a dual gate structure of the first transistor T1. Thus, the overall manufacturing process can be simplified and the process cost may be reduced.

According to an embodiment of the inventive concept, synchronization of an output signal of a driving device can be easily performed, and a capacitor is provided with an increased capacity, thereby increasing an operation speed of a pixel and improving display characteristics. According to an embodiment of the inventive concept, a shape of an electrode can be changed, and thus, a plurality of elements can be further provided to increase an integration density of a pixel. According to an embodiment of the inventive concept, a plurality of elements can be formed by a single process, which can simplify a process of fabricating a display panel and to reduce process cost.

While exemplary embodiments of the inventive concepts have been particularly shown and described, it will be understood by one of ordinary skill in the art that variations in form and detail may be made therein without departing from the spirit and scope of the attached claims.

What is claimed is:

1. A display panel, comprising:
    a first transistor that includes a first semiconductor pattern that contains an oxide, a first control electrode that overlaps the first semiconductor pattern, and a first input electrode and a first output electrode, wherein the first input electrode and the first output electrode are disposed on a different layer from the first control electrode and are respectively coupled to two different portions of the first semiconductor pattern;
    a capacitor that includes a first electrode coupled to the first control electrode, and a second electrode coupled to the first output electrode;
    a light emitting element connected to the capacitor and the first transistor and that includes a light emitting layer; and
    an additional control electrode connected to the second electrode,
    wherein the additional control electrode overlaps the first control electrode and the first semiconductor pattern in a plan view, wherein the additional control electrode and the second electrode are disposed on a same layer and form a single body and disposed on a different layer from the first input electrode and the first output electrode.

2. The display panel of claim 1, wherein
the first semiconductor pattern is disposed between the additional control electrode and the first control electrode, and
the additional control electrode is disposed directly below a channel re pion of the first semiconductor pattern, when viewed in a sectional view.

3. The display panel of claim 1, wherein the additional control electrode completely overlaps a channel region of the first semiconductor pattern, when viewed in a plan view.

4. The display panel of claim 1, further comprising
a metal pattern spaced apart from the first semiconductor pattern and that forms a first capacitor, along with the first input electrode, wherein the metal pattern and the second electrode are disposed on a same layer.

5. The display panel of claim 4, wherein the metal pattern and the second electrode are connected to each other and form a single body.

6. The display panel of claim 5, wherein the metal pattern and the additional control electrode are connected to each other and form a single body.

7. The display panel of claim 4, wherein the first input electrode receives a power voltage which is higher than a cathode voltage of the light emitting element.

8. The display panel of claim 7, wherein the first capacitor has capacitance determined by a potential difference between an anode voltage of the light emitting element and the power voltage.

9. The display panel of claim 1, further comprising
a metal pattern spaced apart from the first semiconductor pattern and that forms a first capacitor along with the first control electrode, wherein the metal pattern and the second electrode are disposed on a same layer.

10. The display panel of claim 9, wherein the metal pattern and the second electrode are connected to each other and form a single body.

11. The display panel of claim 1, further comprising:
a second transistor that includes a second semiconductor pattern that contains silicon, a second control electrode that overlaps the second semiconductor pattern, and a second input electrode and a second output electrode, wherein the second input electrode and the second output electrode are respectively coupled to two different portions of the second semiconductor pattern; and
a third transistor that includes a third semiconductor pattern that contains silicon and is spaced apart from the second semiconductor pattern, a third control electrode that overlaps the third semiconductor pattern, and a third input electrode and a third output electrode, wherein the third input electrode and the third output electrode are respectively coupled to two different portions of the third semiconductor pattern,
wherein the second output electrode is coupled to the first electrode, and the third output electrode is coupled to the second electrode.

12. The display panel of claim 11, further comprising
an upper electrode disposed on the second control electrode and that overlaps the second control electrode in a plan view,
wherein the second control electrode and the first electrode are disposed on a same layer, and the upper electrode and the second electrode are disposed on a same layer.

13. The display panel of claim 1, wherein the additional control electrode completely overlaps the first control electrode and partially overlaps the first semiconductor pattern in a plan view.

14. A display panel, comprising:
a first transistor that includes a first semiconductor pattern that contains oxide, a first control electrode that overlaps a channel region of the first semiconductor pattern, a first input electrode coupled to an input region of the first semiconductor pattern, and a first output electrode coupled to an output region of the first semiconductor pattern;
a first capacitor connected to the first transistor, wherein the first capacitor includes a first electrode and a second electrode that face each other; and
a light emitting element connected to the second electrode, wherein the light emitting element includes a light emitting layer,
wherein the second electrode includes a first portion that overlaps the first electrode and a second portion that completely overlaps the channel region of the first semiconductor pattern, when viewed in a plan view.

15. The display panel of claim 14, wherein the first output electrode is connected to the second electrode.

16. The display panel of claim 14, wherein the second electrode further includes a third portion connected to the second portion, and the third portion is spaced apart from the first semiconductor pattern and overlaps the first input electrode, when viewed in a plan view.

17. The display panel of claim 14, wherein the second electrode further includes a third portion connected to the second portion, and the third portion is spaced apart from the first semiconductor pattern and overlaps the first control electrode, when viewed in a plan view.

18. The display panel of claim 14, further comprising
a second transistor that includes a second semiconductor pattern that contains silicon, a second control electrode that overlaps the second semiconductor pattern, and a second input electrode and a second output electrode,
wherein the second input electrode and the second output electrode are respectively coupled to two different portions of the second semiconductor pattern, wherein the second output electrode is coupled to the first electrode.

19. The display panel of claim 18, wherein the second control electrode and the first electrode are disposed on a same layer.

20. The display panel of claim 18, further comprising
a third transistor that includes a third semiconductor pattern that, contains silicon and is spaced apart from the second semiconductor pattern, a third control electrode that overlaps the third semiconductor pattern, and a third input electrode and a third output electrode,
wherein the third input electrode and the third output electrode are respectively coupled to two different portions of the third semiconductor pattern, wherein the third output electrode is coupled to the second electrode.

21. A display panel, comprising:
a first transistor that includes a first semiconductor pattern that contains an oxide, a first control electrode that overlaps the first semiconductor pattern, and a first input electrode and a first output electrode, wherein the first input electrode and the first output electrode are disposed on a different layer from the first control electrode and are respectively coupled to two different portions of the first semiconductor pattern;

a capacitor that includes a first electrode coupled to the first control electrode, and a second electrode coupled to the first output electrode; and an additional control electrode connected to the second electrode, wherein the additional control electrode overlaps the first control electrode and the first semiconductor pattern in a plan view, wherein the additional control electrode and the second electrode are disposed on a same layer and form a single body and disposed on a different layer from the first input electrode and the first output electrode, and wherein the first semiconductor pattern is disposed between the additional control electrode and the first control electrode.

22. The display panel of claim 21, wherein the additional control electrode completely overlaps the first control electrode and partially overlaps the first semiconductor pattern in a plan view.

\* \* \* \* \*